(12) United States Patent
Lawson et al.

(10) Patent No.: US 7,468,904 B2
(45) Date of Patent: Dec. 23, 2008

(54) APPARATUS FOR HARDENING A STATIC RANDOM ACCESS MEMORY CELL FROM SINGLE EVENT UPSETS

(75) Inventors: David C. Lawson, Haymarket, VA (US); Jason Ross, Fairfax, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 153 days.

(21) Appl. No.: 11/678,097

(22) Filed: Feb. 23, 2007

(65) Prior Publication Data
US 2008/0205112 A1    Aug. 28, 2008

(51) Int. Cl.
G11C 11/00    (2006.01)
(52) U.S. Cl. .................. 365/154; 365/148; 365/149
(58) Field of Classification Search .............. 365/154, 365/156, 148, 149
See application file for complete search history.

(56) References Cited

U.S. PATENT DOCUMENTS

| | | | |
|---|---|---|---|
| 4,805,148 A | 2/1989 | Diehl-Nagle et al. | |
| 4,833,644 A | 5/1989 | Plus et al. | |
| 4,903,094 A | 2/1990 | Plus et al. | |
| 5,204,990 A | 4/1993 | Blake et al. | |
| 5,310,694 A | 5/1994 | Houston | |
| 5,572,460 A | 11/1996 | Lien | |
| 5,631,863 A * | 5/1997 | Fechner et al. | 365/156 |
| 5,905,290 A | 5/1999 | Houston | |
| 6,111,780 A * | 8/2000 | Bertin | 365/154 |
| 6,271,568 B1 | 8/2001 | Woodruff et al. | |
| 6,285,580 B1* | 9/2001 | Phan et al. | 365/156 |
| 6,717,233 B1 | 4/2004 | Haddad et al. | |
| 6,744,661 B1 | 6/2004 | Shubat | |
| 6,937,053 B2 | 8/2005 | Carlson et al. | |
| 7,200,031 B2* | 4/2007 | Liu et al. | 365/154 |
| 2004/0233701 A1 | 11/2004 | Turner | |

FOREIGN PATENT DOCUMENTS

| | | |
|---|---|---|
| TW | 0440829 B | 6/2001 |
| WO | WO99/63542 | 12/1999 |
| WO | WO03/090229 A3 | 10/2003 |

* cited by examiner

*Primary Examiner*—Richard Elms
*Assistant Examiner*—Toan Le
(74) *Attorney, Agent, or Firm*—Daniel J. Long; Antony P. Ng; Dillon & Yudell LLP

(57) ABSTRACT

A single event upset (SEU) hardened memory cell to be utilized in static random access memories is disclosed. The SEU hardened memory cell includes a first inverter and a second inverter connected to each other in a cross-coupled manner. The SEU hardened memory cell also includes a first resistor, a second resistor and a capacitor. The first resistor is connected between an input of the first inverter and an output of the second inverter. The second resistor is connected between an input of the second inverter and an output of the first inverter. The capacitor is connected between an input of the first inverter and an input of the second inverter.

20 Claims, 5 Drawing Sheets

APPARATUS FOR HARDENING A STATIC RANDOM ACCESS MEMORY CELL FROM SINGLE EVENT UPSETS

The present invention was made with United States Government support under contract number DTRA01.03.D.0007.0005 awarded by Defense Threat Reduction Agency. The United States Government has certain rights in the present invention.

BACKGROUND OF THE INVENTION

1. Technical Field

The present invention relates to memory circuits in general, and in particular to static random access memory circuits. Still more particularly, the present invention relates to an apparatus for hardening a static random access memory cell from single event upsets.

2. Description of the Prior Art

A static random access memory (SRAM) circuit typically includes multiple six-transistor memory cells. In certain environments, such as satellite orbital space, in which the level of radiation is relatively intense, SRAMs are more susceptible to single event upsets (SEUs) or soft errors. Also, as the channel widths of transistors scale below 250 nm range, current six-transistor memory cells employing cross-coupled resistor based isolation do not effectively dampened SEU.

Generally speaking, SEUs are caused by electron-hole pairs created by, and travelling along the path of, a single energetic particle as it passes through SRAM cells. Should the energetic particle generate a critical charge within a storage node of an SRAM cell, the logic state of the SRAM cell will be upset. Thus, the critical charge is the minimum amount of electrical charge required to change the logic state of the SRAM cell.

Smaller transistors result in less drive current to restore the internally discharged node. Available resistor physical design area and gate capacitance are also less, which reduces the RC time constant between cross-coupled nodes within a SRAM cell. Consequently, it would be desirable to provide an improved apparatus for hardening a SRAM cell from SEUs.

SUMMARY OF THE INVENTION

In accordance with a preferred embodiment of the present invention, a single event upset (SEU) hardened memory cell includes a first inverter and a second inverter connected to each other in a cross-coupled manner. The SEU hardened memory cell also includes a first resistor, a second resistor and a capacitor. The first resistor is connected between an input of the first inverter and an output of the second inverter. The second resistor is connected between an input of the second inverter and an output of the first inverter. The capacitor is connected between an input of the first inverter and an input of the second inverter.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
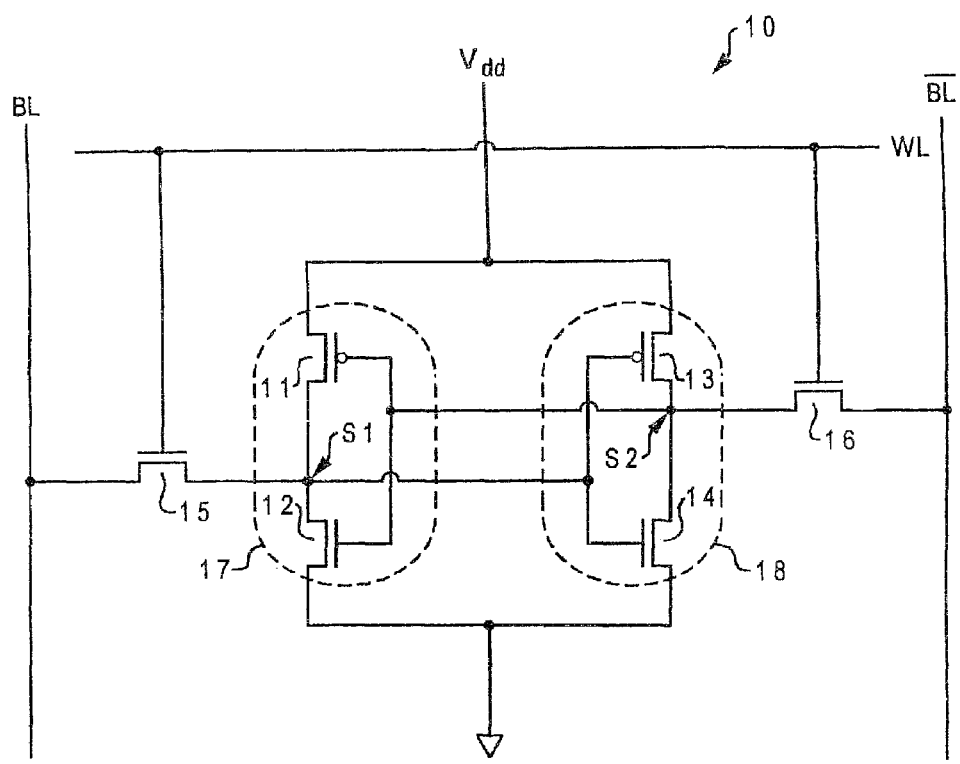
FIG. 1 is a circuit diagram of a conventional static random access memory (SRAM) cell.

Referring now to the drawings and in particular to FIG. 1, there is illustrated a circuit diagram of a conventional static random access memory (SRAM) cell. As shown, an SRAM cell 10 is formed by two cross-coupled complementary metal oxide semiconductor (CMOS) inverters 17 and 18. Inverter 17 includes a p-channel transistor 11 and an n-channel transistor 12, and inverter 18 includes a p-channel transistor 13 and an n-channel transistor 14. The gates of transistors 11 and 12 are connected to the drains of transistors 13 and 14, and the gates of transistors 13 and 14 are connected to the drains of transistors 11 and 12. This arrangement of inverter 17 and inverter 18 is commonly referred to as cross-coupled inverters, and the two lines connecting the gates and the drains of inverters 17 and 18 are commonly referred to as cross-coupling lines. An n-channel pass transistor 15, having its gate connected to a wordline WL, is coupled between a bitline BL and a node S1. Similarly, an n-channel pass transistor 16, also having its gate connected to wordline WL, is coupled between a bitline $\overline{BL}$ and a node S2. When enabled, pass transistors 15, 16 allow data to pass in and out of SRAM cell 10 from bitlines BL and $\overline{BL}$, respectively. Pass transistors 15, 16 are enabled by wordline WL, which has a state that is a function of the row address within an SRAM. The row address is decoded by a row decoder (not shown) within the SRAM such that only one out of n wordlines is enabled, where n is the total number of rows of memory cells in the SRAM.

During operation, the voltages of nodes S1 and S2 are logical complements of one another, due to the cross-coupling of inverters 17 and 18. When wordline WL is energized by the row decoder according to the row address received, pass transistors 15 and 16 will be turned on, coupling nodes S1 and S2 to bit lines BL and $\overline{BL}$, respectively. Accordingly, when wordline WL is high, the state of SRAM cell 10 can establish a differential voltage on BL and $\overline{BL}$.

The logic state of SRAM cell 10 can be changed by a single event upset (SEU) in many ways. For example, if a single energetic particle, such as an alpha particle, strikes the drain of transistor 11 of inverter 17, electrons will diffuse towards a power supply $V_{dd}$ of inverter 17, and holes collected at the drain will change the output voltage of inverter 17 at node S1 from a logic low to a logic high when transistor 12 is on and transistor 11 is off. However, if the alpha particle strikes the drain of transistor 12 of inverter 17, holes will drift towards ground, and electrons collected at the drain will change the output voltage of inverter 17 at node S1 from a logic high to a logic low when transistor 11 is on and transistor 12 is off.

Figure 2:
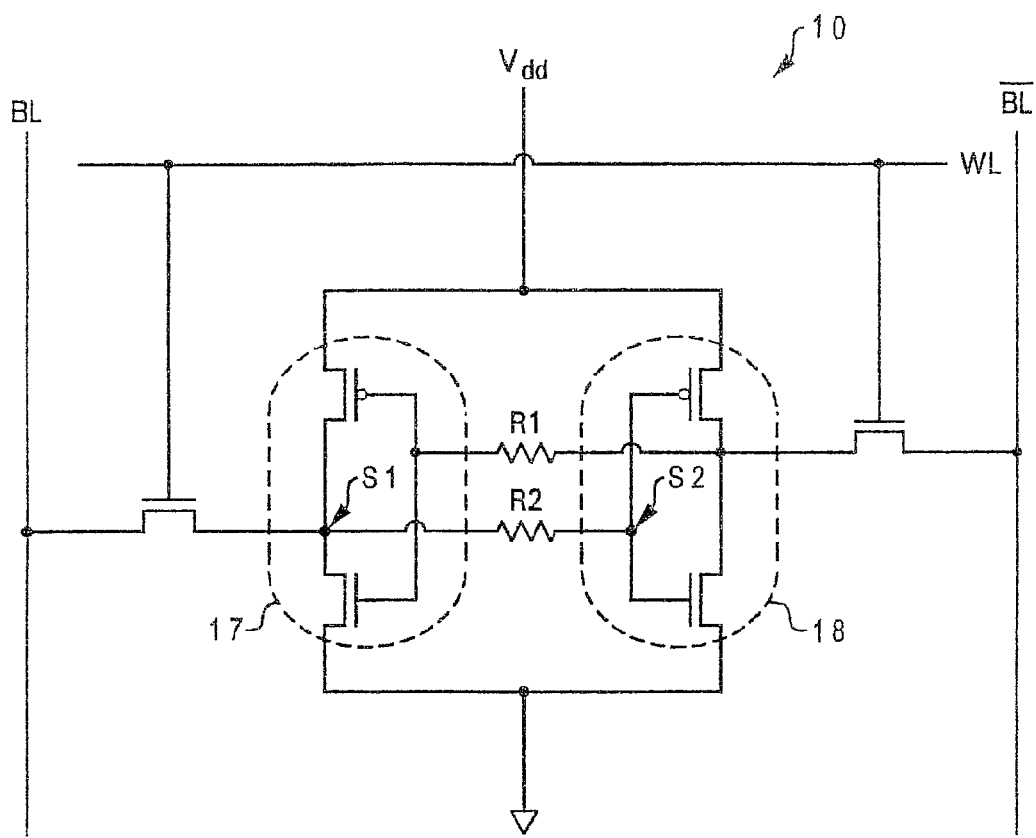
FIG. 2 is a circuit diagram of a single event upset (SEU) hardened SRAM cell using a resistive approach.

One method of reducing the susceptibility of a memory cell to SEUs is by increasing the critical charge of the memory cell. With reference now to FIG. 2, there is illustrated a circuit diagram of an SEU-hardened SRAM cell using a resistive approach. The SEU hardening scheme for SRAM cell 10' is based on increasing the critical charge required to produce SEUs, and that is accomplished by increasing the resistance of the cross-coupling lines of the cross-coupled inverters from FIG. 1. FIG. 2 illustrates the same circuit as shown in FIG. 1 with the exception that resistors R1 and R2 are included in the cross-coupling lines of inverters 17 and 18.

The purpose of resistors R1 and R2 is to increase the RC time constant delay associated with the gate capacitances of transistors 11-14. The initial effect of an energetic particle strike to a node of SRAM cell 10', say node S1, is to change the voltage of node S1. Upset will occur if this voltage change propagates through the cross-coupling of inverters 17 and 18 before the initial voltage of node S1 can be restored. The increased RC delay can slow the feedback propagation through the cross-coupling and allows more time for recovery of the initially affected node S1. But this increase in RC propagation delay also slows the write cycle time of SRAM cell 10'. Because the write cycle of SRAMs has typically been faster than the read cycle, some slowing of the write cycle has been viewed as acceptable, especially since the read cycle time is usually more performance critical. However, as memory cells are scaled to smaller geometries, the speed of the write cycle of SRAM cells becomes more critical than in previous SRAM designs. In addition, due to dramatically reduced nodal capacitance, the added resistance in SRAM cell 10' is not enough to filter a transient because there is only a very small capacitance. As a result, the resistive approach to SEU hardening is no longer desirable for SRAMs.

Figure 3:
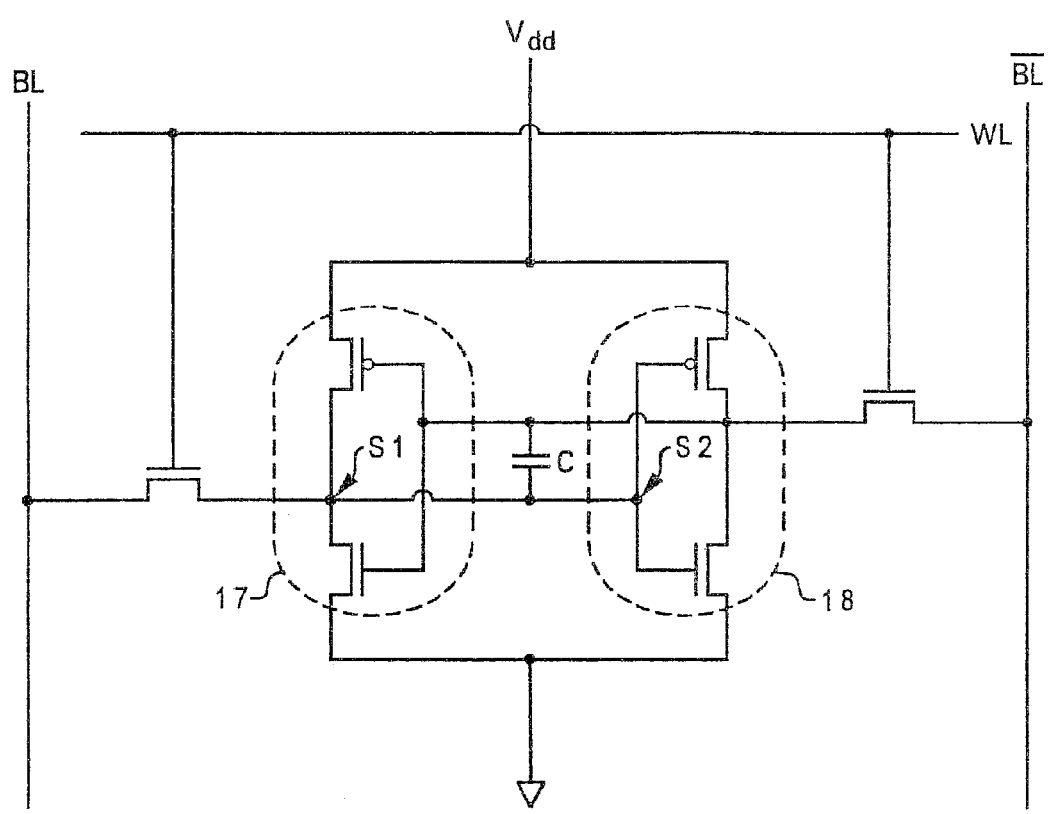
FIG. 3 is a circuit diagram of an SEU-hardened SRAM cell using a capacitive approach.

Another method of reducing the susceptibility of memory cell 10 from FIG. 1 to SEU is to increase the capacitance on the drains of inverters 17 and 18 of memory cell 10, thus decreasing the voltage change on a node for a given amount of collected charge. Referring now to FIG. 3, there is illustrated a circuit diagram of an SEU-hardened SRAM cell using a capacitive approach. FIG. 3 illustrates the same circuit as shown in FIG. 1 with the exception that a capacitor C is connected across the drains of inverters 17 and 18. By having capacitor C located between the gate and drain of inverters 17 and 18, the effective capacitance is increased by the Miller effect. Also, with capacitor C connected between the gate and drain, a change in the drain voltage will induce a change in the gate voltage such that restoring current is increased. Furthermore, the increased capacitance on the gate will increase the RC delay in the feedback path, thus increasing the resistance to SEUs as well as retarding changes in logic state. However, the capacitive approach to SEU hardening is not very practical because it slows down the speed of the memory cell.

Figure 4:
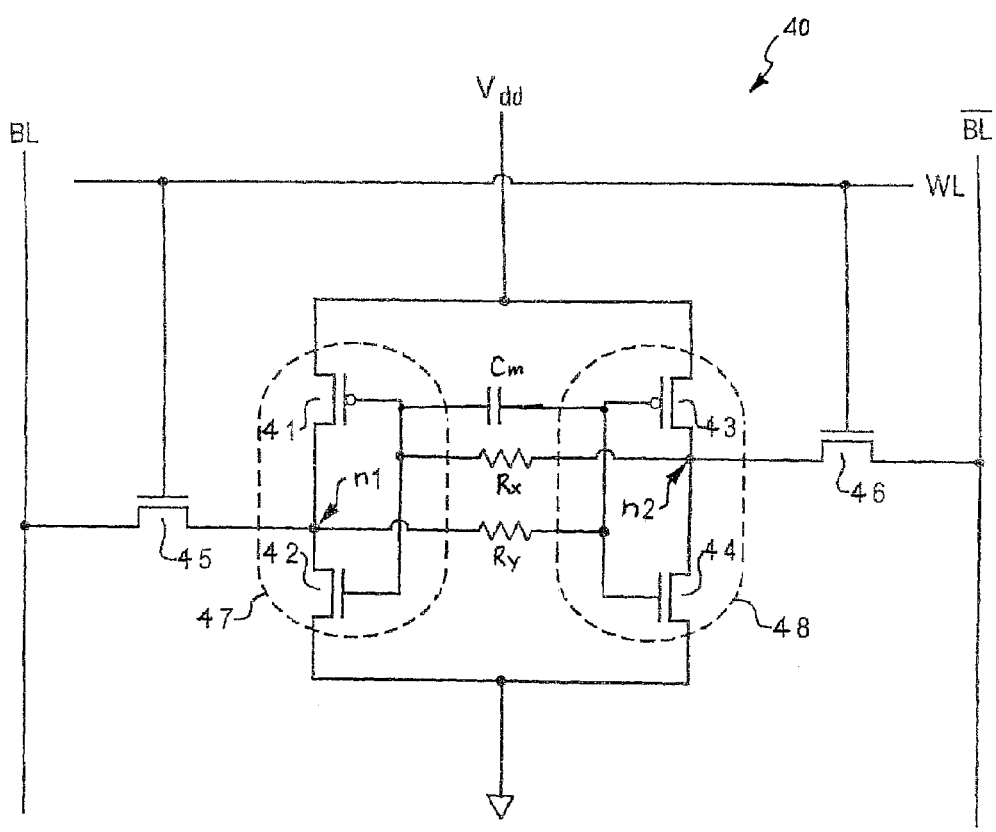
FIG. 4 is a circuit diagram of an SEU-hardened SRAM cell, in accordance with a preferred embodiment of the present invention.

With reference now to FIG. 4, there is illustrated a circuit diagram of an SEU-hardened SRAM cell, in accordance with a preferred embodiment of the present invention. As shown, an SRAM cell 40 is formed by two cross-coupled inverters 47 and 48. Inverter 47 includes a p-channel transistor 41 and an n-channel transistor 42, and inverter 48 includes a p-channel transistor 43 and an n-channel transistor 44. An n-channel pass transistor 45, having its gate connected to a wordline WL, is coupled between a bitline BL and a node n1. Similarly, an n-channel pass transistor 46, also having its gate connected to wordline WL, is coupled between a bitline $\overline{BL}$ and a node n2. When enabled, pass transistors 45-46 allow data to pass in and out of SRAM cell 40 from bitlines BL and $\overline{BL}$, respectively.

Resistors Rx and Ry are included in the cross-coupling lines of inverters 47 and 48. In addition, a capacitor Cm is connected between the gates of transistors 41-42 and the gates of transistors 43-44. Capacitor Cm is preferably made of metal-insulator-metal (MIM) because it occupies less physical area. For example, capacitor Cm can be physically placed above transistors 41-44 in a vertical dimension, essentially sharing the same silicon footprint with transistors 41-44. However, capacitor Cm may be constructed with materials other than aluminum and a dielectric insulator. Other structures that may 11 be used for capacitor Cm include poly-poly capacitors, trench capacitors, etc.

MIM capacitor Cm provides positive feedback during a SEU event on a positively biased drain of one of transistors 42 or 44 storing a "1" in SRAM cell 40. For example, node ni1 is temporarily discharged (grounded) by the SEU event while the "0" is momentarily coupled to node n2, reinforcing or maintaining the original state of the latched circuit until recombination occurs and the transient dissipates.

The combination of Rx, Ry and Cm create a RC filter network that is more superior in comparison to simply using a capacitor between the gate nodes. Additional capacitance from internal nodes to ground also improve the SEU immunity of SRAM cell 40.

Figure 5:
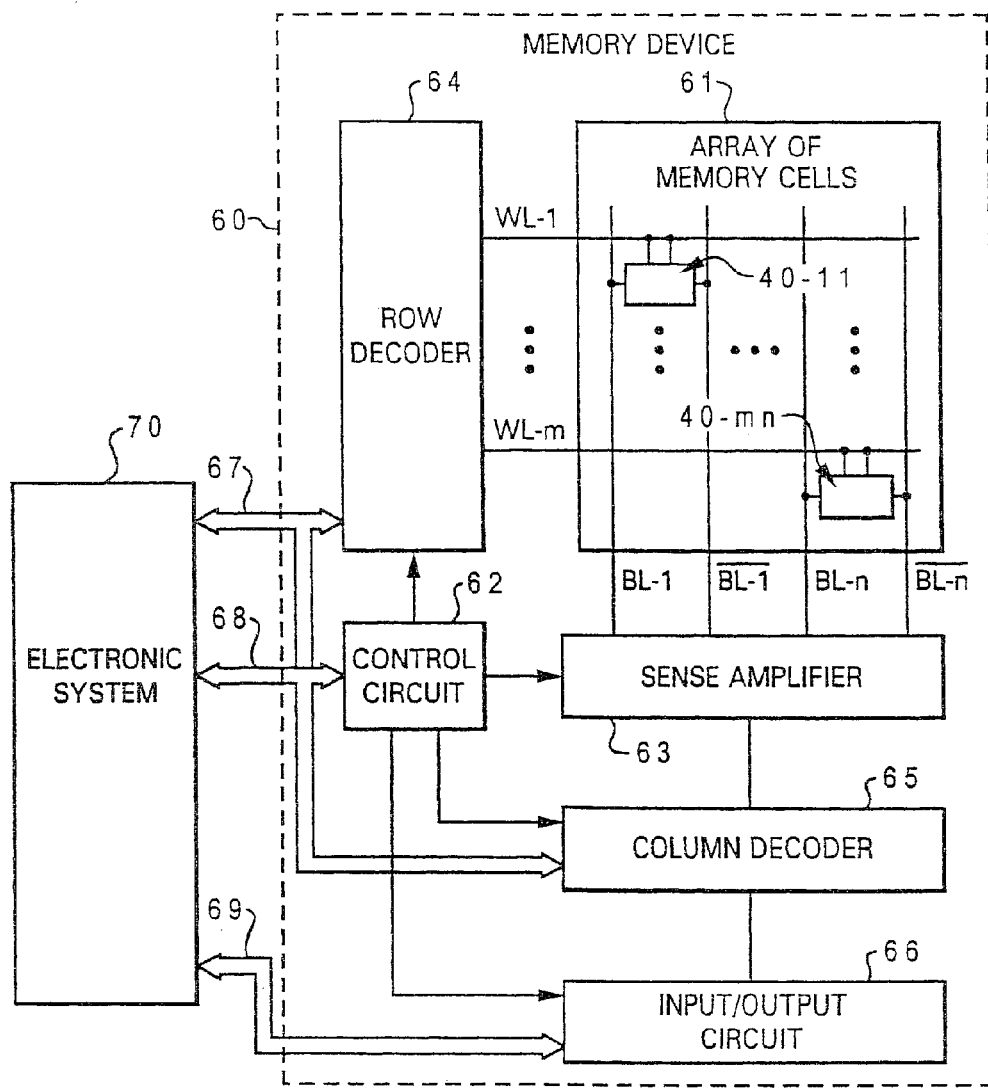
FIG. 5 is a block diagram of an apparatus in which the SEU-hardened SRAM cell from FIG. 4 may be incorporated.

As has been described, the present invention provides a SEU-hardened memory cell to be utilized in SRAMs. The present invention may be implemented in a variety of apparatuses having an SRAM. For example, referring now to FIG. 5, there is depicted a block diagram of an apparatus in which an SRAM may be incorporated. As shown, the apparatus includes an electronic system 70 coupled to a memory device 60. Electronic system 70 may be, for example, a processor, a memory controller, a chip set or any system that stores data in a memory device such as memory device 60. Electronic system 70 is coupled to a row decoder 64 and a column decoder 65 of memory device 60 via address lines 67. Electronic system 70 is also coupled to a control circuit 62 of memory device 60 via control lines 68. In addition, electronic system 70 is coupled to an input/output circuit 66 of memory device 60 via input/output lines 69.

Memory device 60 includes a sense amplifier 63 and a memory cell array 61. Array 61 includes a number of wordlines, WL-1 through WL-m, and a number of bit line pairs, BL-1 through BL-n (and $\overline{BL}$-1 through $\overline{BL}$-n). Array 61 is constructed to use a memory cell sensing scheme such that each bit line pair is to be used in reading and writing data into a SRAM cell such as SRAM cell 40-11. Memory device 60 is controlled by control circuit 62. Control circuit 62 is coupled to row decoder 64, column decoder 65, input/output circuit 66, and sense amplifier 63.

Memory device 60 reads and writes data for electronic system 70. For example, in order to read a value from SRAM cell 40-11 in a read operation, electronic system 70 provides the address of SRAM cell 40-11 to row decoder 64 over address lines 67. Electronic system 70 also provides control signals to control circuit 62 over control lines 68. Control circuit 62 provides signals to sense amplifier 63 that causes an equilibrate circuit (not shown) within sense amplifier 63 to equilibrate the voltages on bit lines BL-1 and $\overline{BL}$-1. The equilibrate circuit of sense amplifier 63 forces bit lines BL-1 and $\overline{BL}$-1 to a common voltage; for example, $V_{dd}$-$V_t$. It is noted that the voltage range between the high and low logic levels for sense amplifier 63 differs from that of SRAM cell 40-11.

With the charge on bit line pair, sense amplifier 63 next detects the logic state of SRAM cell 40-11. Column decoder 65 receives the column address of the selected cell from electronic system 70. Column decoder 65 identifies the appropriate bit line pair for sense amplifier 63 to use in reading the value from SRAM cell 40-11. Sense amplifier 63 senses and amplifies the differential voltage across the bit line pair and thus produces high and low logic levels on complementary nodes of sense amplifier 63 that correspond to the states of the sensed bit line pair. These voltage levels are passed to electronic system 70 by input/output circuit 66 via input/output lines 69.

In a write operation, electronic system 70 provides data to be written to, for example, SRAM cell 40-11 over input/output lines 69 to input/output circuit 67. Column decoder 65 receives the column address from electronic system 70 via address lines 67 to select the appropriate bit line pair for the selected SRAM cell. Sense amplifier 63, under the control of control circuit 62, forces the bit line pair for SRAM cell 40-11 to complementary high and low logic levels based on the data to be stored in SRAM cell 40-11. Row decoder 64 receives an address from electronic system 70 over address line 67 that indicates the appropriate wordline to activate for this store operation. In this process, the high and low logic levels for sense amplifier 63 are translated to appropriate voltage levels for SRAM cell 40-11.

While the invention has been particularly shown and described with reference to a preferred embodiment, it will be understood by those skilled in the art that various changes in form and detail may be made therein without departing from the spirit and scope of the invention.

What is claimed is:

1. A single event upset hardened memory cell comprising:
   a first inverter and a second inverter connected to each other in a cross-coupled manner;
   a first resistor connected between an input of said first inverter and an output of said second inverter;
   a second resistor connected between an input of said second inverter and an output of said first inverter; and
   a capacitor connected between an input of said first inverter and an input of said second inverter.

2. The memory cell of claim 1, wherein said first inverter includes an n-channel transistor and a p-channel transistor.

3. The memory cell of claim 1, wherein said second inverter includes an n-channel transistor and a p-channel transistor.

4. The memory cell of claim 1, wherein said capacitor is a metal-insulator-metal capacitor.

5. The memory cell of claim 4, wherein said metal-insulator-metal capacitor is located above said first and second inverters.

6. The memory cell of claim 1, wherein said capacitor is a poly-poly capacitor.

7. The memory cell of claim 1, wherein said capacitor is a trench capacitor.

8. A memory device, comprising:
   a sense amplifier;
   an addressing circuitry having a row decoder and a column decoder;
   an array of wordlines and complementary bit line pairs, coupled to said sense amplifier and said addressing circuitry;
   a plurality of memory cells located at an intersection of each of said wordlines and said bitline pairs, wherein each of said plurality of memory cells has a single event upset hardened bi-stable circuit that includes:
      a first inverter and a second inverter connected to each other in a cross-coupled manner;
      a first resistor connected between an input of said first inverter and an output of said second inverter;
      a second resistor connected between an input of said second inverter and an output of said first inverter; and
      a capacitor connected between an input of said first inverter and an input of said second inverter.

9. The memory device of claim 8, wherein said first inverter includes an n-channel transistor and a p-channel transistor.

10. The memory device of claim 8, wherein said second inverter includes an n-channel transistor and a p-channel transistor.

11. The memory device of claim 8, wherein said capacitor is a metal-insulator-metal capacitor.

12. The memory device of claim 11, wherein said metal-insulator-metal capacitor is located above said first and second inverters.

13. The memory device of claim 8, wherein said capacitor is a poly-poly capacitor.

14. The memory device of claim 8, wherein said capacitor is a trench capacitor.

15. An apparatus, comprising:
   an electronic system; and
   a memory device having a plurality of memory cells, wherein each of said plurality of memory cells has a single event upset hardened bi-stable circuit that includes:
      a first inverter and a second inverter connected to each other in a cross-coupled manner;
      a first resistor connected between an input of said first inverter and an output of said second inverter;
      a second resistor connected between an input of said second inverter and an output of said first inverter; and
      a capacitor connected between an input of said first inverter and an input of said second inverter.

16. The apparatus of claim 15, wherein said first inverter includes an n-channel transistor and a p-channel transistor, and said second inverter includes an n-channel transistor and a p-channel transistor.

17. The apparatus of claim 15, wherein said capacitor is a metal-insulator-metal capacitor.

18. The apparatus of claim 17, wherein said metal-insulator-metal capacitor is located above said first and second inverters.

19. The apparatus of claim 15, wherein said capacitor is a poly-poly capacitor.

20. The apparatus of claim 15, wherein said capacitor is a trench capacitor.

* * * * *